United States Patent [19]

Edwards

[11] Patent Number: 4,651,270
[45] Date of Patent: Mar. 17, 1987

[54] DELAY CIRCUIT FOR INVERTER SWITCHES

[75] Inventor: Charles W. Edwards, Monroeville Boro, Pa.

[73] Assignee: Westinghouse Electric Corp., Pittsburgh, Pa.

[21] Appl. No.: 795,398

[22] Filed: Nov. 6, 1985

[51] Int. Cl.[4] .......................................... H02P 13/20
[52] U.S. Cl. ........................................ 363/96; 363/57; 363/136; 307/597; 307/603
[58] Field of Search ...................... 363/55-58, 363/68, 71, 78-79, 96, 135-138; 307/252 C, 252 L, 252 P, 252 Q, 270, 597, 599, 603, 605, 606-608

[56] References Cited

U.S. PATENT DOCUMENTS

| | | | |
|---|---|---|---|
| 3,032,714 | 5/1962 | Cohen | 307/595 X |
| 3,808,466 | 4/1974 | Campbell | 307/597 |
| 4,180,853 | 12/1969 | Scorso, Jr. et al. | 363/96 |
| 4,231,083 | 10/1980 | Matsuda et al. | 363/135 |
| 4,253,140 | 2/1981 | McMurray | 363/96 |
| 4,302,713 | 11/1981 | Cutler et al. | 363/96 X |
| 4,441,087 | 4/1984 | Nilssen | 331/113 A |
| 4,447,867 | 5/1984 | Evans et al. | 363/56 |

Primary Examiner—Peter S. Wong
Attorney, Agent, or Firm—C. M. Lorin

[57] ABSTRACT

Transistors or GTO's of an inverter are switched ON/OFF with a delay circuit which has a capacitor first charged at a forcing rate, then, held at an intermediary level, and which is first discharged at a forcing rate, then held at an intermediary level, thereby to provide underlap, minimum ON and OFF time control and noise filtering with a high precision.

12 Claims, 8 Drawing Figures

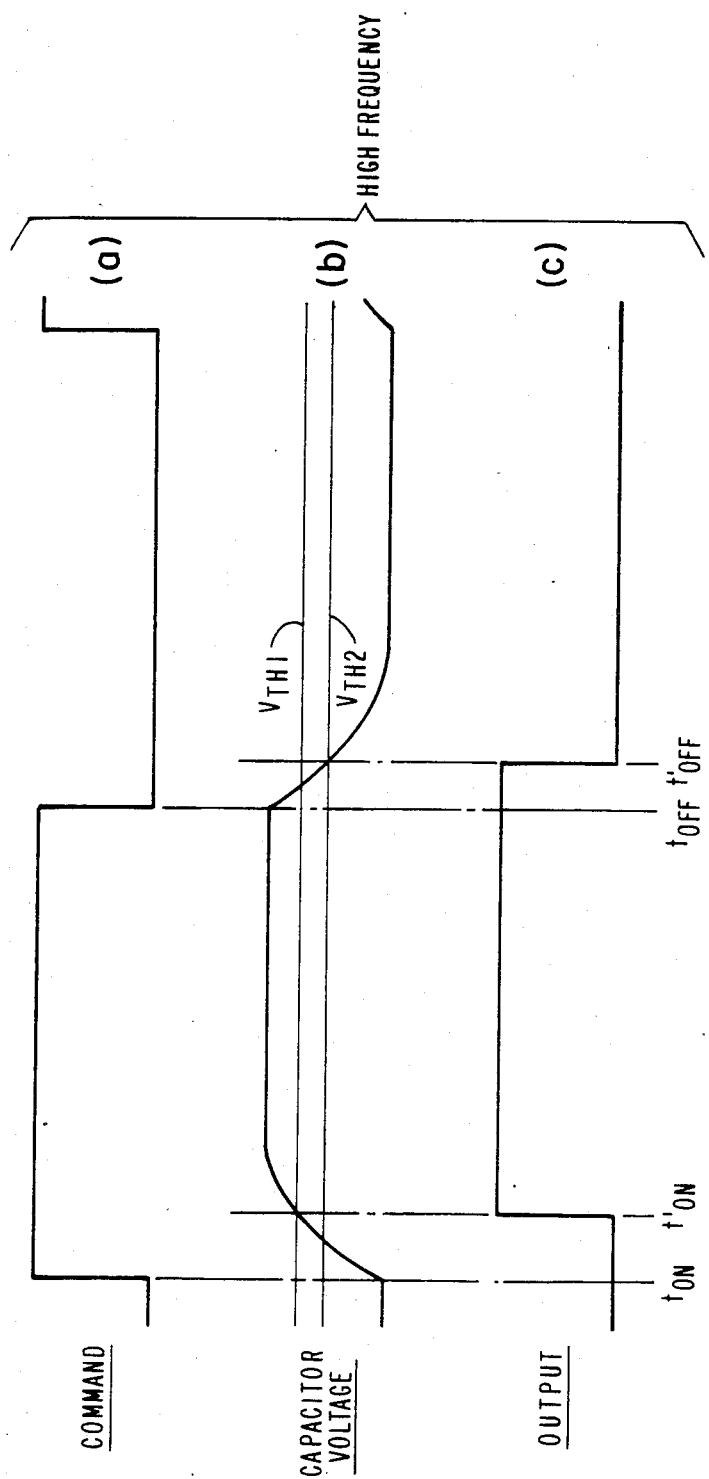

DELAY CIRCUIT FOR INVERTER SWITCHES

BACKGROUND OF THE INVENTION

The invention relates to sequential firing of static power switches in general, and more particularly to the generation of successive commands into ON and OFF stages of successive transistors, or GTO power switches.

Most driver circuits, typically for inverters, which use transistors, or GTO's, have a built-in delay which performs one or more of the following three functions:

Underlap, i.e. a time delay interposed between the OFF stage and the ON state of successive static switches;

Minimum ON and OFF time Control for snubber discharge;

Noise filtering.

In most inverter configurations, two inverter switches are connected in series across a DC voltage or current source. If both switches are inadvertently gated ON simultaneously, undesirable consequences may result. To prevent this, a slight delay between the turning OFF of one switch and the turning ON of the opposite switch is introduced. This is usually referred to as "underlap". It is often implemented by adding deliberate delays in the driver circuits so that the turn-ON delay will be longer than the turn-OFF delay. If the control commands both switches in a complementary manner, the underlap will occur naturally.

Minimum ON and OFF times are necessary with switch configurations which use snubbers because, for proper operation, the snubber must have been set into a certain state before the next transition can occur. Also, noise filtering is usually required, because the high voltage slew across the control signal isolation (optocoupler, transformer, etc.) tends to inject noise into the sensitive part of the driver circuit.

A delay circuit in the prior art usually consists of an RC charging and discharging network and a comparator. Such circuits, however, cause variations in the turn-ON and turn-OFF times, which variations are detrimental for critical applications, such as high frequency inverters and PWM inverters. The error is due to a variation in the state of the timing capacitor voltage at the beginning of a command for either change of state. Such variation is dependent upon the time that has elapsed since the previous change of state. In principle, no problem occurs at low frequencies. However, the delays may not be repeatable if the transistions are too closely spaced.

SUMMARY OF THE INVENTION

The invention resides in a delay circuit for charging, or discharging, a capacitor through an RC network with the assist of a comparator operative to detect a delay-related level capacitor voltage, wherein charging or discharging are effected with a predetermined auxiliary voltage in excess of said delay-related level, thereby to accelerate transition to the detection operative stage of said comparator; and wherein switching means is provided, automatically controlled by the comparator upon detecting such delay-related level, to apply to said capacitor a fixed voltage at said delay-related level, while switching off said auxiliary voltage.

The delay circuit according to the invention is initially triggered for charging said capacitor when a static power switch is to be set into the ON state, thereby to impart a delay thereon; and the delay circuit is triggered for discharging said capacitor when a static power switch is to be returned to the OFF state, thereby imparting another delay thereon.

BRIEF DESCRIPTION OF THE DRAWINGS

FIGS. 3A, 3B and 4A, 4B are curves illustrating the operation of a delay circuit of the prior art, with single threshold and with double threshold, respectively;

DESCRIPTION OF THE PREFERRED EMBODIMENT

Figure 1:
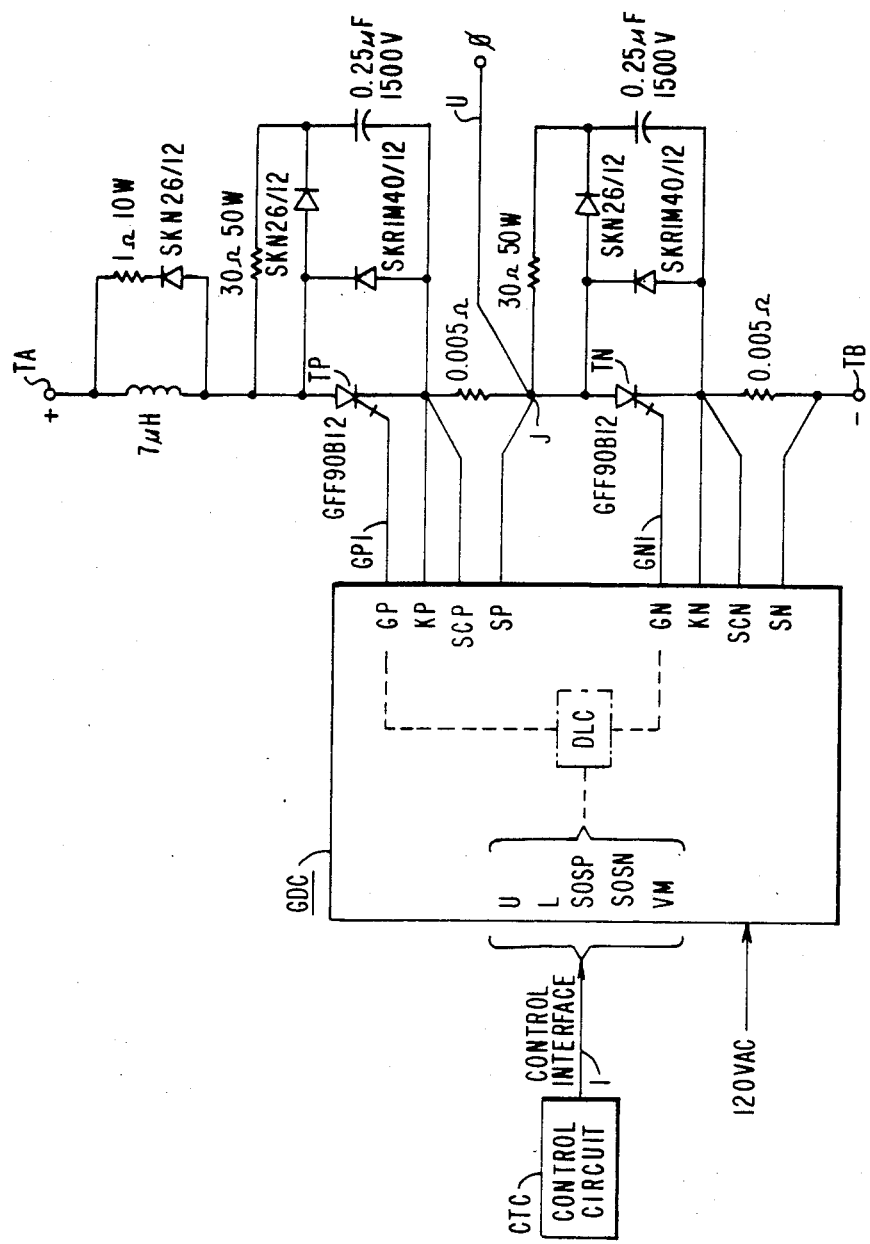
FIG. 1 shows a GTO's pole with its gate drive circuit including a delay circuit.

FIG. 1 shows one pole of an inverter connected across the DC link positive and negative terminals (TA, TB), including two serial connected GTO's (TP and TN) with one AC output phase line U connected at their nodal point J. A solid state gave drive circuit GDC provides a positive gate pulse on line GP1 to the control electrode of the positive GTO device TP, while a negative gate pulse is applied by line GN1 to the control electrode of the negative GTO device TN. Snubber circuitry involving diodes, inductances, resistors and capacitors is provided with each GTO devices, as generally known, and as numerically identified in FIG. 1.

The turn-ON and turn-OFF commands, derived on line 1 from the control circuit CTC, are applied to the power portion of the gate drive circuit GDC to establish the ON/OFF command, then, through delay circuit DLC which is internal to DLC.

The invention relates to the structure and functions of the delay circuit DLC. Before considering delay circuit DLC, reference should be had to FIGS. 2, 3A, 3B which relate to prior art delay circuits.

Figure 2:
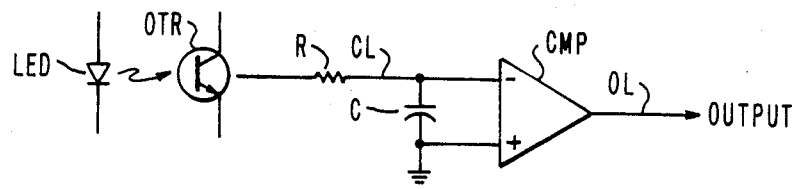
FIG. 2 is a delay circuit of the prior art.

FIG. 2 shows the basic prior art circuit for establishing a delay in the transmission of a command from a light emittive diode (LED) associated with an optocoupler transistor OTR. When transistor OTR is conducting, the charging line CL is connected to a charging voltage (not shown) which is effective on an RC network to charge the capacitor C. At both ends of capacitor C is connected a comparator CMP which will become effective to transmit the command signal on its output line OL, whenever a predetermined voltage has been established between the inverting and non-inverting inputs of the comparator. Capacitor C and resistor R establish the time constant in making the command signal effective on line OL.

Figure 3A:
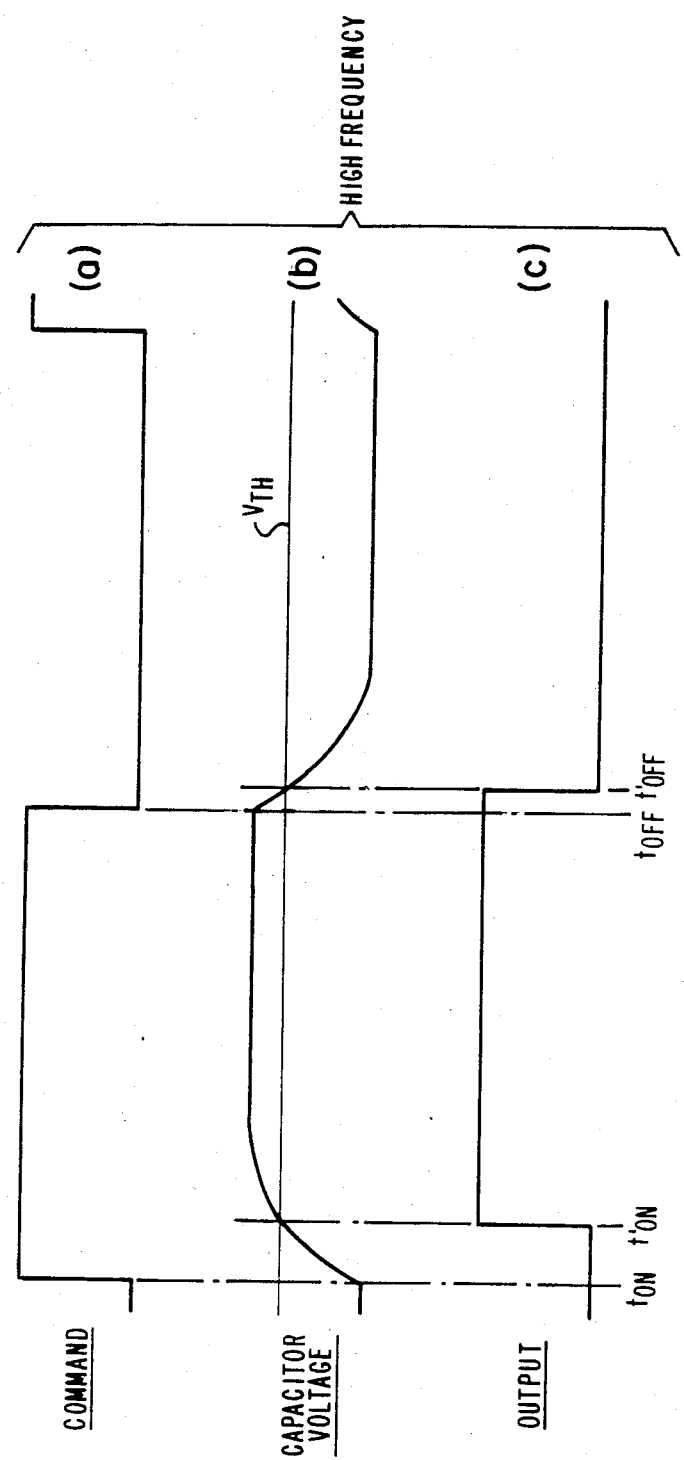

FIG. 3A shows, with a prior art delay circuit, how the time delay to be ON and the time delay to be OFF are affected by the transition in charging and discharging in the capacitor voltage for a predetermined threshold voltage $V_{TH}$. Under (a) is the command signal with its ON state marked by the front edge at time $t_{ON}$ and the OFF state marked by the tail end at time $t_{OFF}$. Upon charging, the associated comparator detects the threshold at time $t'_{ON}$. The imparted delay is $\Delta t = (t'_{ON} - t_{ON})$. Upon discharging, the comparator detects the threshold at time $t'_{OFF}$, the imparted delay being $\Delta t' = (t'_{OFF} - t_{OFF})$.

The command signal of curve (a), and line 1 in FIG. 1 ($t_{ON}$ to turn ON, $t_{OFF}$ to turn OFF), affects two opposite static power devices such as in FIG. 1, so that one is being turned ON after the other has been turned OFF. This signal is converted to the command signal of line OL (FIG. 2) as shown by curve (c) defined between times $t'_{ON}$ and $t'_{OFF}$.

Figure 3B:
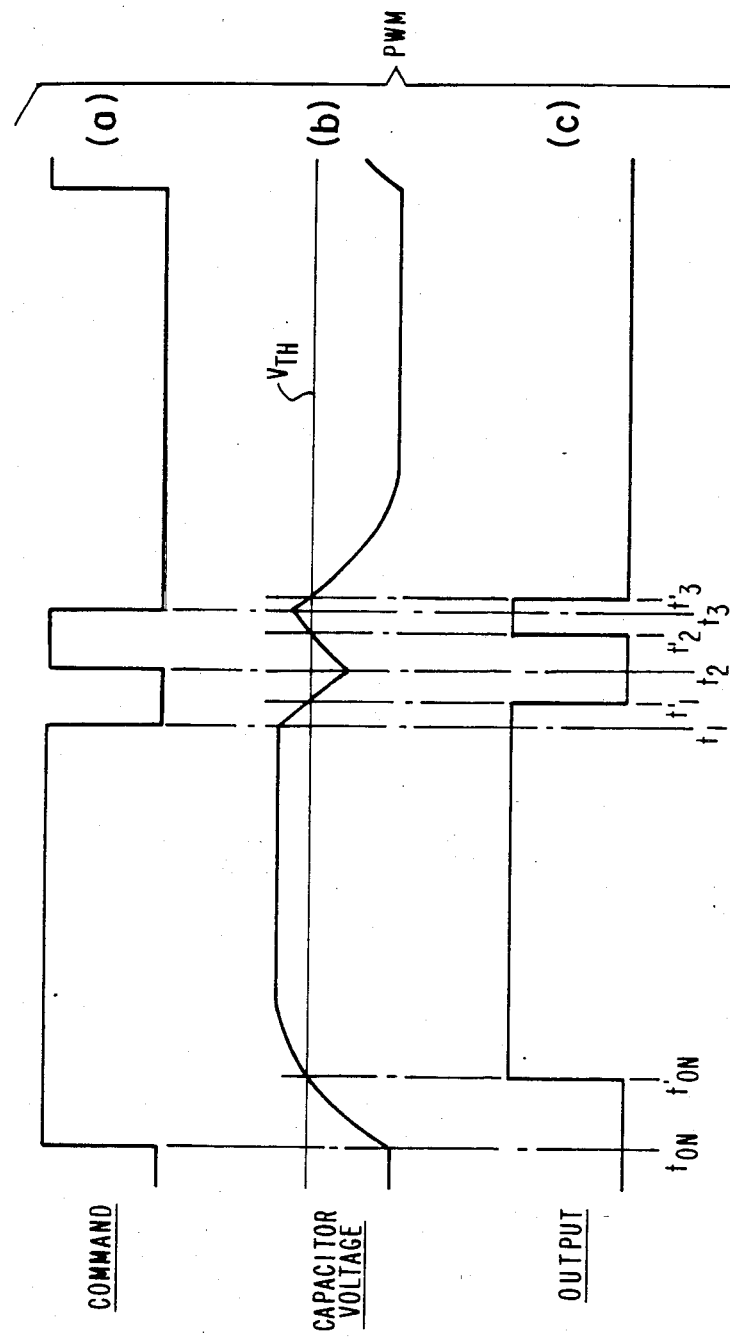

FIG. 3B shows the command signal under (a) being a pulse-width modulation command (main command followed by notches). Curve (b) shows the discharging and charging process being repeated from notch to notch about the threshold voltage, with concurrent instants $t_1$, $t_2$, $t_3$ upon the command signal under (a) and $t'_1$, $t'_2$, $t'_3$, as acknowledged by the comparator.

Figure 4B:
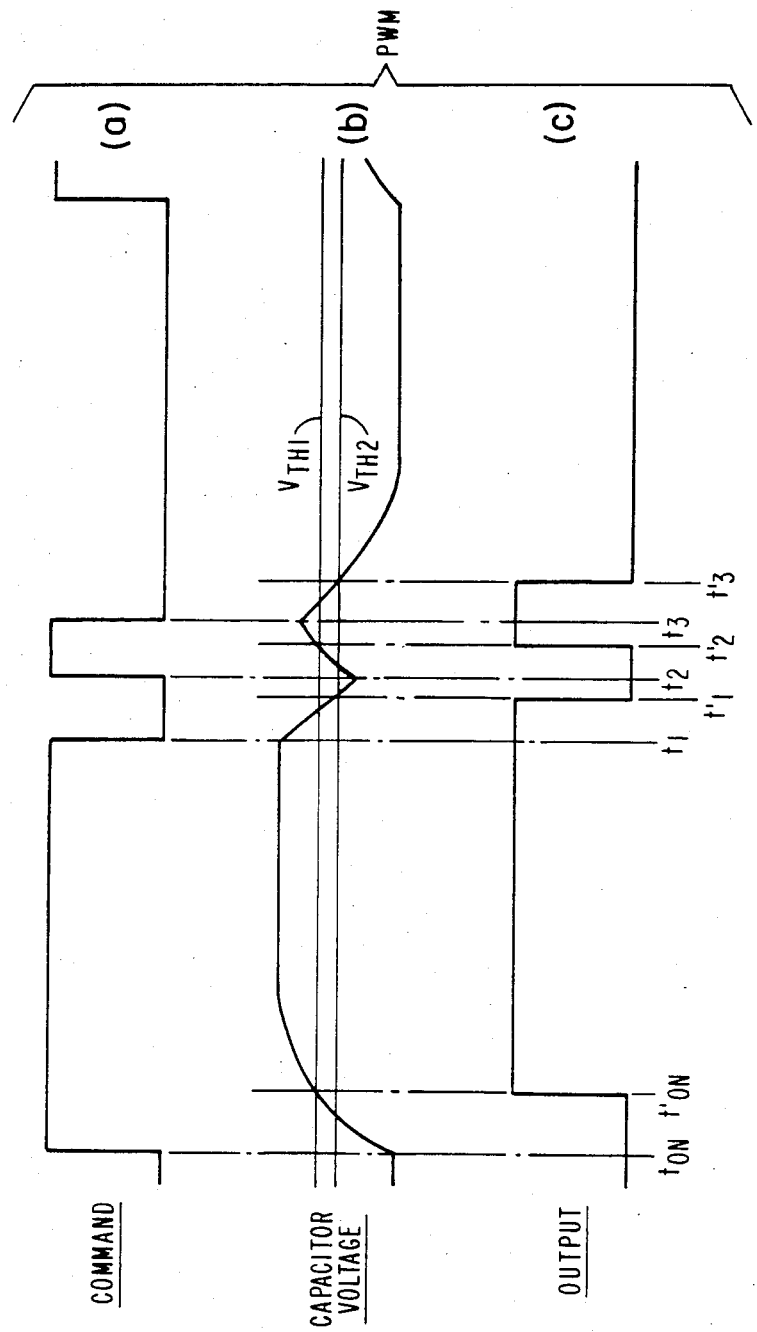

FIGS. 4A, 4B show the effect upon the original command signal when two threshold voltages are used, one for charging, the second for discharging. FIG. 4B, like FIG. 3A, is for an ordinary command signal under (a), whereas FIG. 3B corresponds to the pulse-width-modulation situation, under (a). The single threshold example shows that with PWM modulation the delays introduced by the delay circuit can vary. Moreover, there is no minimum ON or OFF time guaranteed. This is important, though, in order to insure "underlap", i.e. a predetermined minimum time delay between the OFF and the ON state, as well as minimum ON and OFF time control for snubber discharge, and to allow noise filtering.

In order to be sure, in the absence of a minimum, the introduced delays have been lengthened. However, such added time causes more voltage and/or current distortion. In contrast, the double threshold approach of FIGS. 4A, 4B provides minimum ON and OFF time, since one threshold is calculated for the charging phase, whereas the second threshold is independently chosen for the discharging phase. This may be true for the first passage through the threshold, but upon repeated such transitions, there is a "memory" effect on the capacitor charge and variable time delays for the ON/OFF command are introduced. The double threshold method has been improved by adding diodes to clamp the capacitor voltage just above the upper threshold and just below the lower threshold. Adding the diodes at low control voltage levels introduces diode drops which may become significant by their adverse effect.

Another approach is to rapidly force the capacitor voltage to its asymptotic value immediately after a transition has been made. The objection here lies in that some sort of pulse circuit is required which is edge sensitive and therefore noise sensitive. As a practical matter, if IC technology is used, the pulse circuit is usually designed to charge and/or discharge the timing capacitor at, or near, the maximum current handling capability of the ICs used, so as to make the pulse circuit action negligible compared to the delay timing. Therefore, the delay timing components will be of a much higher impedance than the pulse charge/discharge circuit. This will decrease noise immunity.

The solution to the aforementioned problem will now be described by reference to FIG. 5.

The delay circuit according to the invention involves capacitor $C_t$, resistors R1 and R2 and includes time constant components $R_1$, $R_2$ and $C_t$, a one pole/four throw electronic switch SW, comparators CMP1, CMP2 and a choice of serially connected voltage sources $E_1$, $E_2$, $E_3$. Typically, $E_1 = E_2 = E_3 = V/3$, where V is the total voltage $E_1 + E_2 + E_3$.

An optical transistor OTR, turned ON by a light emitting diode LED, provides a command signal on line CL to a logic circuit LG which determines the positions of switch SW, in accordance with the outputs OL1, OL2 of comparators CMP1, CMP2, and in accordance with the command signal CL, to output a precisely delayed command on line OL to the controlled thyristor. The junction IV1 between $E_1$ and $E_2$ is at an intermediary voltage of $2V/3$, whereas the junction IV2 between $E_2$ and $E_3$ is at an intermediary voltage $V/3$. $R_1$ is connected between the high voltage V end and position D of switch SW. The low level voltage, or negative end of voltage source $E_3$, is connected to position A of switch SW. IV1 goes by line $L_1$ to the inverting input of comparator CMP1, and also goes to position C of switch SW. IV2 goes by line $L_2$ to the non-inverting input of comparator CMP2, and also goes to position B of switch SW. By lines HV from the positive end of voltage source $E_1$, and LV from the negative end of voltage source $E_3$, the logic circuit LG knows and provides the feedback paths for high voltage and low voltage in relation to CMP1 and CMP2, respectively.

Figure 5:
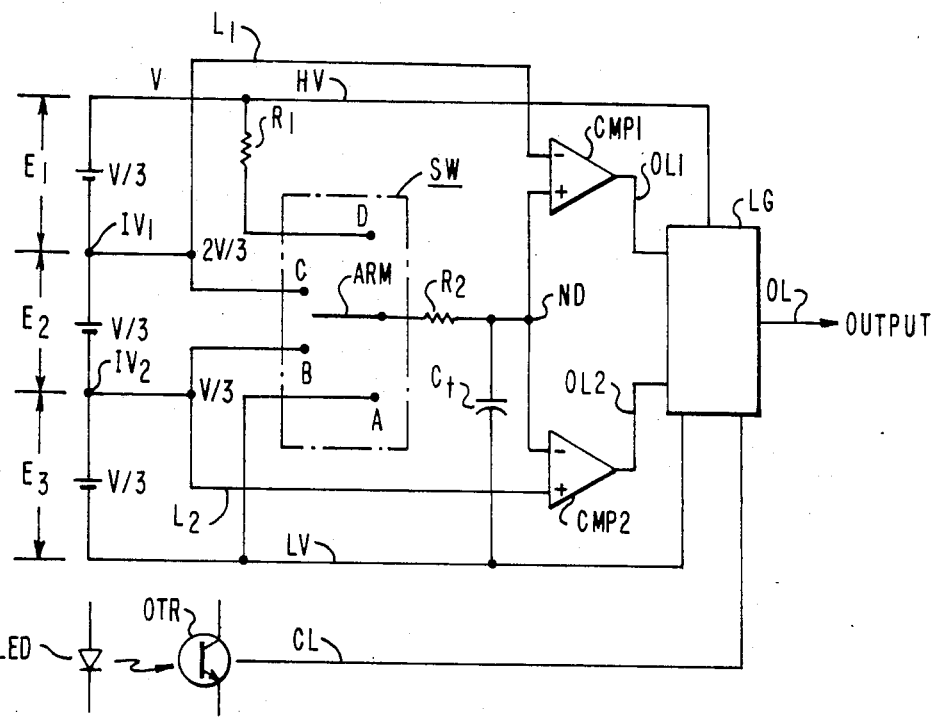
FIG. 5 shows the basic delay circuit according to the invention.

The operation of the delay circuit of FIG. 5 is as follows:

When the circuit is OFF and the command signal of line CL is to be OFF, the electronic switch SW is set by logic circuit LG to position B. The capacitor voltage will eventually charge to $V/3$ volts. The output is set to OFF by logic circuit LG. If the command of line CL becomes ON, switch SW is set to D, thus charging the capacitor through $R_1$ and $R_2$ with a forcing voltage of the maximum voltage V volts. When the charge of capacitor Ct is detected to reach $2V/3$ volts, comparator CMP1 will make a low to high transition. The logic circuit LG will then change the output on OL to ON and set switch SW to position C, causing the capacitor to hold at $2V/3$ volts.

If the command is now changed to OFF, the logic circuit LG will set switch SW to position A, thereby discharging the capacitor through $R_2$ with a forcing minimal voltage of 0 V. When the charge of capacitor Ct reaches $V/3$ volts, comparator CMP2 will make a low to high transition, causing the logic LG to turn the output of OL to OFF and setting switch SW at position B. The capacitor will now hold a $V/3$ volts. Since the capacitor has been charged through both $R_1$ and $R_2$ when the ON delay was performed, but has been discharged through $R_2$ only, the resulting OFF delay will be shorter than the ON delay.

The sequence of operations can be summarized in the following table:

TABLE

| COMMAND | OUTPUT | ACTION |
|---------|--------|--------|
| OFF | OFF | Hold V/3 via B |
| OFF | ON | Discharge $C_t$ through $R_2$ via A |
| ON | OFF | Charge $C_t$ through $R_1$ and $R_2$ via B |
| ON | ON | Hold 2V/3 via C |

It is observed that a high timing quality is obtained under all operating conditions because the capacitor voltage is held at the comparison threshold ($V/3$, or $2V/3$) after the comparison has been made. The delay circuit has no "memory" of the last transition, because the capacitor voltage is held at some undetermined value at the beginning of the next transition.

The delay circuit according to the invention provides high quality, repeatable delays with essentially no dependence on past state transitions and it uses "low" impedance components to improve noise immunity.

Not only does the delay circuit of FIG. 5 provide high quality, repeatable turn-ON and turn-OFF delays, as are necessary for inverter driver circuits used in high frequency and PWM systems, it also has repeatable guaranteed minimum ON and minimum OFF times as often required. Moreover it uses low impedance components for good noise immunity. A further advantage is that it is "IC intensive" and has fewer high precision passive components than the delay circuits of the prior art.

Figure 6:
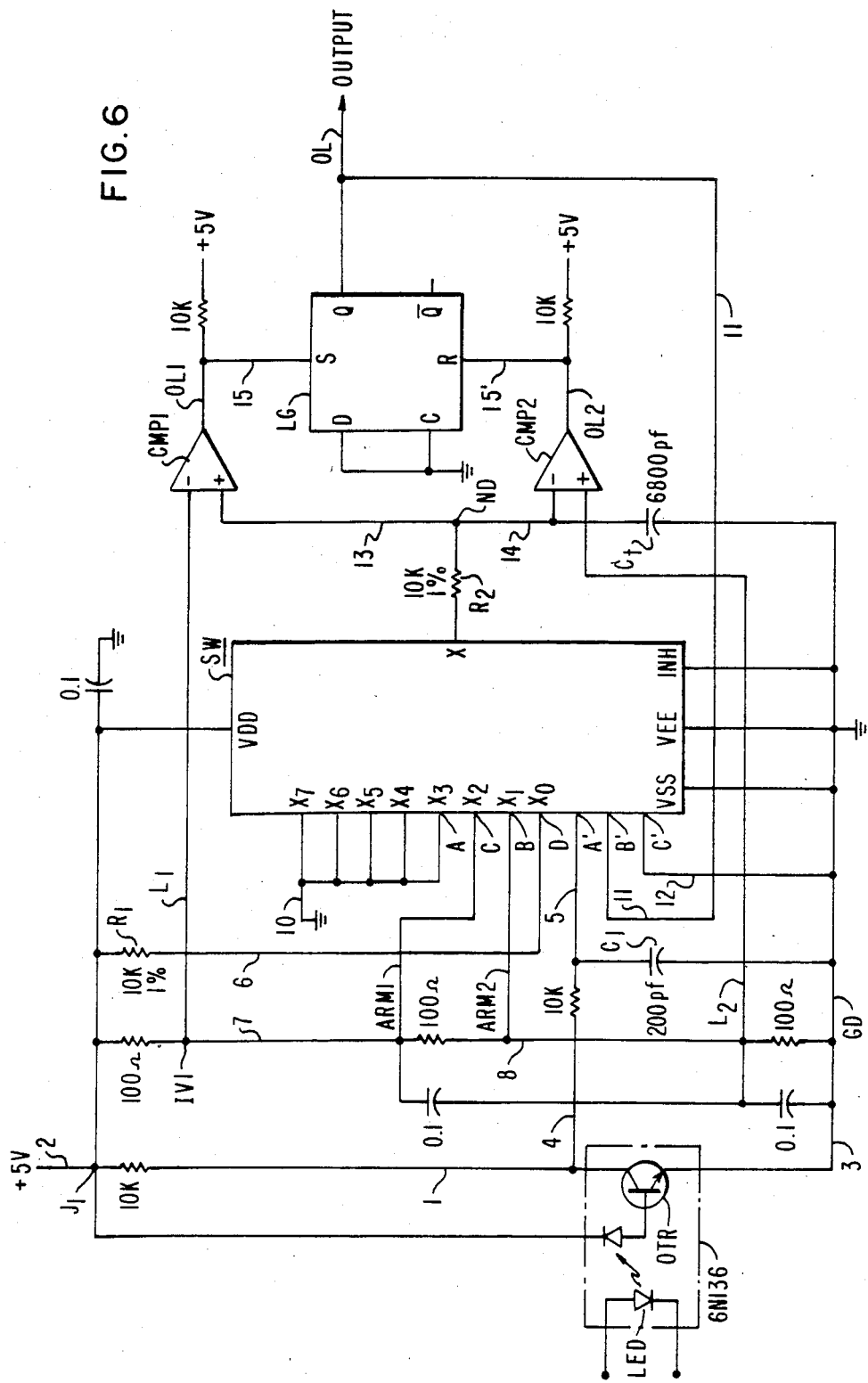
FIG. 6 is the preferred embodiment of the invention.

An implementation of the delay circuit according to the invention is illustratively shown in FIG. 6. References identical to those in FIG. 5 have been used wherever possible. The comparators are also symbolized as CMP1, CMP2 (each an LM339 device). The logic circuit LG is in the form of a flip-flop (No. 4013) having a set pin connected to OL1 by line 15 and a reset pin connected by line 15' to OL2. The output OL is from the Q pin. Line 11 from output line OL goes to pin B' of an analog switch SW (in the form of a solid state device No. 4051). The $\overline{X}$ pin is the moving arm of the switch. It goes through resistor $R_2$ to the nodal point ND between MP1 and MP2. ND goes by line 13 to the non-inverting input of MP1 and by line 14 to the inverting input of MP2. ND further goes via capacitor $C_t$ to ground. Typically, $C_t$ is 6800 pf. $R_2$, typically has 10KΩ. The forced voltage in this case is +5 volts, typically, applied by line 2 to resistor $R_1$ (also 10KΩ) which by line 6 is connected to the D input (at pin $X_O$).

A capacitor $C_1$ (200 pf) is connected between the ground GD and by line 5 to pin A' of switch SW. The optical transistor OTR is connected between ground GD (line 3) and line 1 which, via a resistor (10K), goes to the forcing voltage of line 2 at junction $J_1$. Between line 3 (ground GD) and $J_1$ (5 volts) extends a serial network of three resistors of 100Ω each. IV1 is the nodal point between the first pair, and IV2 the nodal point between the second pair, thus, defining on line $L_1$ to the inverting input of MP1 and on line $L_2$ to the non-inverting input of MP2, the intermediate fixed voltages held when detected by MP1, MP2, respectively, upon charging, or upon discharging, as explained earlier in relation to FIG. 5. From IV1 by lines 7 and arm ARM1, the voltage at IV1 is applied to pin $X_2$ for switch position C, whereas from IV2 via lines 8 and arm ARM2, the second intermediate voltage is applied to pin $X_1$ for switch position B. Pin $X_3$ (as well as solid state device pins $X_5$–$X_7$) is connected to ground by line 10 so as to establish switch position A. The operation is as described earlier by reference to FIG. 5.

I claim:

1. A delay circuit interposed between an input pulse signal and an output pulse signal, the latter being a delayed representation of said input pulse signal; the delay circuit comprising:
    at least one first voltage source having an extreme voltage level and a second voltage source having an intermediate voltage level;
    integrating means having an initial voltage level; said first and second voltage source voltage levels being respectively extreme and intermediate relative to said initial voltage level;
    switch means responsive to said input pulse signal for initially coupling said integrating means with said first source to change said initial voltage level as a function of time toward said extreme voltage level;
    comparator means having a threshold substantially equal to said intermediate voltage level; said comparator means being operative at said threshold level to control said switch means for coupling of said integrating means to said second voltage source, thereby to hold said integrating means to said intermediate voltage level;
    said comparator means outputting said output pulse signal concurrently with said comparator means threshold control operation.

2. The delay circuit of claim 1 with said integrating means including a capacitor and being responsive in a charging mode to charge said capacitor as a function of time in response to an input pulse signal for an ON state in said output pulse signal;
    with said integrating means being responsive in a discharging mode to discharge said capacitor as a function of time in response to an input pulse signal for an OFF state in said output pulse signal;
    said output pulse signal being applied successively to at least two static power switches due to be turned OFF by said output pulse signal in the OFF state and the other to be turned on by said output pulse signal in the ON state.

3. The delay circuit of claim 2 with said input and output pulse signals being applied in succession at a high frequency.

4. The delay circuit of claim 2 with said input and output pulse signals being applied as a pulse-width-modulation signal.

5. The delay circuit of claim 2 with said comparator means including a first comparator operating in said charging mode and a second comparator operating in said discharging mode.

6. The delay circuit of claim 5 with the extreme voltage in the charging mode being provided by a maximum voltage source, with the extreme voltage in the discharging mode being provided by a minimum voltage source, with a first intermediate voltage being provided in the charging mode lower than said maximum voltage, with a second intermediate voltage being provided in the discharging mode lower than said first intermediate voltage and higher than said minimum voltage.

7. The delay circuit of claim 6 with said switch means having four positions, a first position for connecting said capacitor to said maximum voltage source, a second position for connecting said capacitor to said first intermediary voltage, a third position for connecting said capacitor to said second intermediary voltage and a fourth position for connecting said capacitor to said minimum voltage source.

8. The delay circuit of claim 7 with first resistor means being interposed between said capacitor and said maximum voltage source when said switch means is in the first position and said integrating means is in the charging mode.

9. The delay circuit of claim 8 with second resistor means being connected in series with said capacitor when said switch means is in said second, third and fourth positions; said second resistor means having a resistance smaller than the resistance of said first resistor means.

10. The delay circuit of claim 9 with said first comparator means having a threshold substantially equal to said first intermediate voltage, for shifting said switch means from said first position to said second position after charging said integrating means to the level of said first intermediate voltage in the charging mode.

11. The delay circuit of claim 10 with said second comparator means having a threshold substantially equal to said second intermediate voltage, for shifting said switch means from said fourth position to said third position after discharging said integrating means to the level of said second intermediate voltage in the discharging mode.

12. The delay circuit of claim 11, with a logic circuit responsive to the outputs of said first and second comparators for outputting said ouput pulse signals in accordance with the outputs of said first and second comparators.

* * * * *